(12) United States Patent
Ramakrishnan

(10) Patent No.: US 9,893,740 B1
(45) Date of Patent: Feb. 13, 2018

(54) METHODS AND APPARATUS FOR AN ANALOG-TO-DIGITAL CONVERTER

(71) Applicant: SEMICONDUCTOR COMPONENTS INDUSTRIES, LLC, Phoenix, AZ (US)

(72) Inventor: Shankar Ramakrishnan, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/405,487

(22) Filed: Jan. 13, 2017

(51) Int. Cl.
*H03M 1/20* (2006.01)
*H03M 1/56* (2006.01)
*H03M 1/10* (2006.01)

(52) U.S. Cl.
CPC ........... *H03M 1/56* (2013.01); *H03M 1/1009* (2013.01)

(58) Field of Classification Search
CPC ................................ H03M 1/56; H03M 1/1009

USPC ........ 341/155, 156, 172, 122, 139, 140, 120
See application file for complete search history.

(56) References Cited

U.S. PATENT DOCUMENTS

| | | | |
|---|---|---|---|
| 8,810,676 B2 * | 8/2014 | Lim ...................... | H03M 1/144 341/156 |
| 9,571,758 B2 * | 2/2017 | Hashimoto ........ | H04N 5/35545 |
| 2007/0132629 A1 | 6/2007 | van der Ploeg | |
| 2009/0273500 A1 | 11/2009 | Krymski | |
| 2010/0328130 A1 | 12/2010 | Bulzacchelli | |
| 2014/0168449 A1 * | 6/2014 | Yoshida ................. | H04N 5/378 348/175 |

* cited by examiner

*Primary Examiner* — Peguy Jean Pierre
(74) *Attorney, Agent, or Firm* — The Noblitt Group, PLLC; Hettie L. Haines

(57) ABSTRACT

Various embodiments of the present technology may comprise a method and apparatus for an analog-to-digital converter (ADC). The ADC may convert an analog signal to a digital signal utilizing a two-phase conversion process to convert the signal into coarse bits and fine bits. The ADC may generate a time-residue signal and utilize the time-residue signal to determine the fine bits.

19 Claims, 5 Drawing Sheets

METHODS AND APPARATUS FOR AN
ANALOG-TO-DIGITAL CONVERTER

BACKGROUND OF THE TECHNOLOGY

Analog-to-digital converters (ADCs) are utilized in a wide variety of electronic devices and systems to transform an analog signal to a digital signal. One ADC architecture commonly used due to its simple implementation is the single-ramp ADC. Conventional single-ramp ADCs, however, are limited to the number of resolution bits they are able to produce due to having an exponentially increasing counter frequency for each additional bit of resolution.

Another commonly used architecture is the two-stage ramp ADC, which extracts the signal residue of a coarse conversion stage and uses that signal residue to perform the fine conversion. The two-stage ramp ADC, however, also suffers from problems due to the settling time of the coarse conversion stage. In particular, the conversion rate of the two-stage ramp ADCs is limited due to the settling time associated with the staircase waveform of the coarse stage, especially when a large number of ADCs are connected to a common staircase waveform signal, such as in CMOS (complementary metal-oxide semiconductor) image sensing integrated circuits.

SUMMARY OF THE INVENTION

Various embodiments of the present technology may comprise a method and apparatus for an analog-to-digital converter (ADC). The ADC may convert an analog signal to a digital signal utilizing a two-phase conversion process to convert the signal into coarse bits and fine bits. The ADC may generate a time-residue signal and utilize the time-residue signal to determine the fine bits.

BRIEF DESCRIPTION OF THE DRAWING
FIGURES

A more complete understanding of the present technology may be derived by referring to the detailed description when considered in connection with the following illustrative figures. In the following figures, like reference numbers refer to similar elements and steps throughout the figures.

Figure 1:
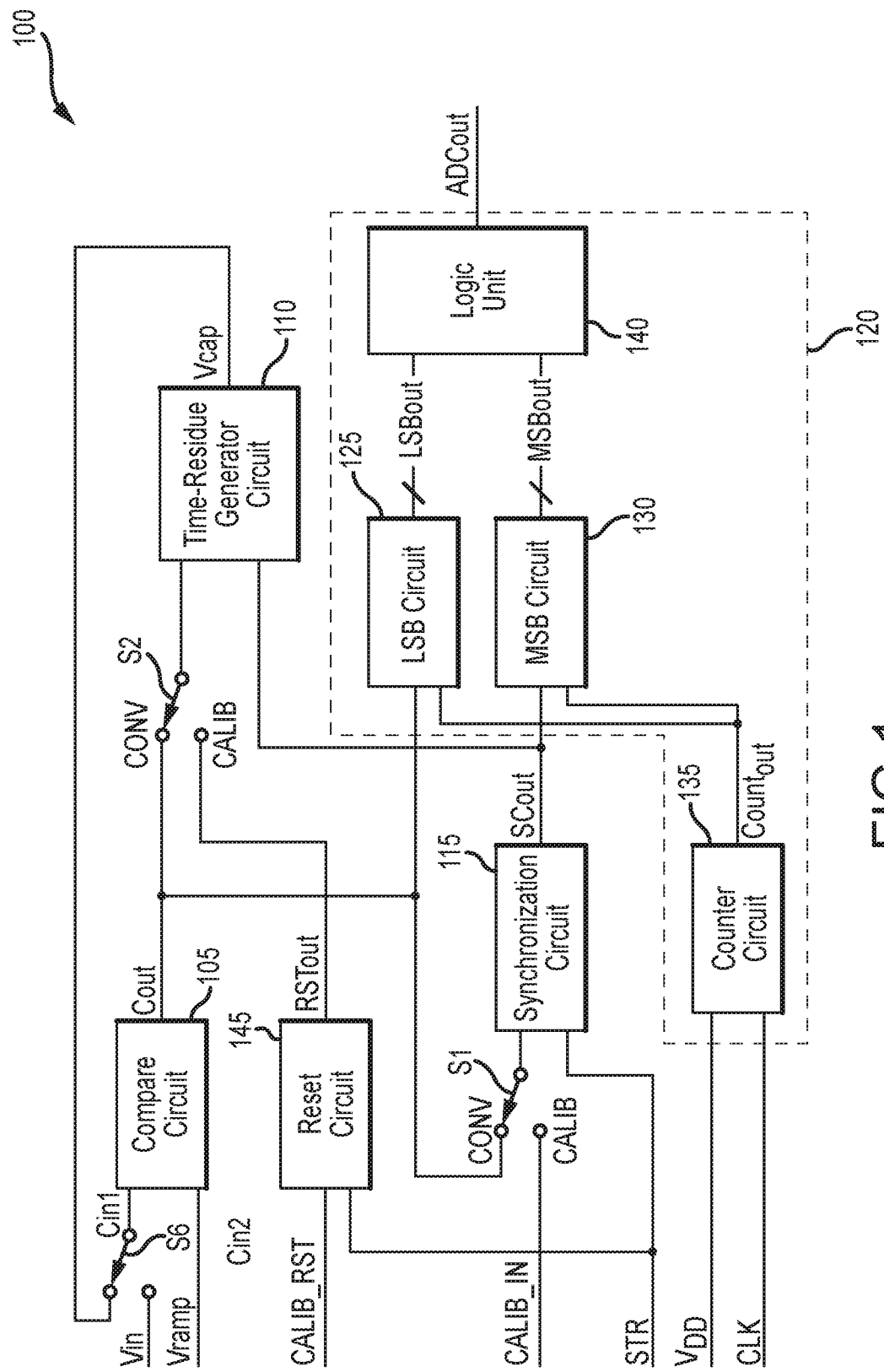
FIG. 1 is a block diagram of an analog-to-digital converter in accordance with an exemplary embodiment of the present technology.

DETAILED DESCRIPTION OF EXEMPLARY
EMBODIMENTS

The present technology may be described in terms of functional block components and various processing steps. Such functional blocks may be realized by any number of components configured to perform the specified functions and achieve the various results. For example, the present technology may employ various semiconductor devices, such as transistors, capacitors, and the like, which may carry out a variety of functions. In addition, the present technology may be practiced in conjunction with any number of systems, such as automotive, aerospace, imaging, and consumer electronics, and the systems described are merely exemplary applications for the technology. Further, the present technology may employ any number of conventional techniques for signal sampling, signal filtering, signal quantization, and generating various signals, such as timing signals, waveforms, and the like.

Methods and apparatus for an ADC 100 according to various aspects of the present technology may operate in conjunction with any suitable electronic system, such as imaging systems, "smart devices," wearables, consumer electronics, and the like. The ADC 100 may convert an analog input signal into a digital output signal according to a two-phase conversion process. The ADC 100 may also perform self-calibration to provide an accurate digital value. The ADC 100 may utilize a smooth waveform and a signal corresponding to a time interval to convert the analog signal into coarse bits (i.e., most-significant bits) and fine bits (i.e., least-significant bits). The ADC 100 may comprise any suitable hardware and/or software to perform self-calibration and to convert the analog signal into a digital signal using the two-phase conversion process. For example, referring to FIGS. 1 and 2, the ADC 100 may comprise a compare circuit 105, a time-residue generator circuit 110, a synchronization circuit 115, and a conversion circuit 120. The ADC 100 may further comprise a control unit (not shown) to transmit various control signals, such as a calibration signal CALIB_IN, reset signal CALIB_RST, and a strobe signal STR, and/or to activate various modes, such as a conversion mode or calibration mode by toggling various switches.

The compare circuit 105 compares two input values, for example two voltage values, and outputs a single-bit value according to the relationship between the two input values. For example, if one input value is greater than the other input value, then the compare circuit 105 may output a digital "1" or "0." The compare circuit 105 may comprise a conventional comparator with a negative input terminal and a positive input terminal.

In an exemplary embodiment, the compare circuit 105 may comprise a conventional comparator 205 with a first input terminal Cin1, a second input terminal Cin2, and an output terminal Cout. The first input terminal Cin1 may be coupled to a switch S6 and associated with the positive input terminal. The switch S6 may receive a signal from the control unit and respond accordingly. The switch S6 may selectively couple the compare circuit 105 to one of two input signals, for example a sampled analog input voltage Vin or a signal from the time-residue generator circuit 110. The second terminal Cin2 may be associated with the negative input terminal and may be coupled to a ramp signal, for example a voltage ramp Vramp. The ramp signal may be generated using any suitable circuit for generating a ramp waveform. The ramp signal may have a smooth waveform, and may be linear or non-linear, for example the ramp waveform may be exponential, parabolic, and the like.

The compare circuit 105 may compare the input voltage Vin to the ramp voltage Vramp. The compare circuit 105 may initially output a digital "1," and switch to a digital "0" output when the ramp voltage Vramp exceeds the input voltage Vin. The output terminal Cout may be selectively coupled to the synchronization circuit 115 and the time-residue generator circuit 110 via switches S1, S2, respectively. Each switch S1, S2, may comprise any suitable device responsive to a signal, such as a transistor. For example, switches S1, S2 may receive a signal from the control unit and respond accordingly.

The synchronization circuit 115 provides a time delay between receiving an input and transmitting an output, and/or prevents metastability. For example, the synchronization circuit 115 may transmit an output value, which is a delayed version of the input value, wherein the time delay is synchronized with a signal, such as the strobe signal STR. The strobe signal STR may comprise a pulse clock signal that is synchronized to a predetermined frequency. In this case, the synchronization circuit 115 ensures that the time delay is always more than a minimum delay dmin, but is not more than this minimum delay dmin plus a total time period of the strobe signal STR. The minimum delay dmin may be more than the time delays incurred in the time residue circuit 110 to ensure that the output codes are not repeated for input samples close to each other, which may lead to differential non-linearity errors.

The synchronization circuit 115 may also prevent the ADC 100 from entering a metastable state. In a metastable state, the ADC 100 may be unable to settle into a stable logic value within the time required for proper circuit operation. The synchronization circuit 115 may comprise any suitable hardware to provide a signal delay and/or prevent metastability.

In various embodiments, the synchronization circuit 115 may receive the strobe signal STR and may further couple to one of the compare circuit output Cout or the calibration signal CALIB_IN. In an exemplary embodiment, the synchronization circuit 115 may comprise a first flip-flop 210 cascaded with a second flip-flop 215. Each flip-flop may comprise a conventional flip-flop, such as a D flip-flop, comprising a data input terminal D, an enable terminal E, and an output terminal Q. The flip-flops may be coupled in series to form a master-slave flip-flop, wherein the output terminal of the first flip-flop 210 is coupled to the data input of the second flip-flop 215, and the enable terminal of the second flip-flop 215 is coupled to an inverter 220. The strobe signal STR may be coupled to the enable terminals of each flip-flop to provide the clock signal to operate the flip-flops. In this arrangement, the second flip-flop 215 only changes in response to a change in the first flip-flop 210. The strobe signal STR may have an asymmetric duty cycle wherein its pulse width is small relative to the total period of the cycle and the pulse width corresponds to the minimum delay dmin. As such, after the minimum delay dmin, the second flip-flop 215 may transmit the input data from the first flip-flop 210 to the time-residue generator circuit 110 and/or the conversion circuit 120. The output terminal Q of the second flip-flop 215 may be coupled to the time-residue generator circuit 110, wherein the time-residue generator circuit is responsive to the output signal. The output terminal Q may further be coupled to the conversion circuit 120, wherein the conversion circuit is responsive to the output signal.

The time-residue generator circuit 110 generates a voltage proportional to a time interval associated with a particular event. The time-residue generator circuit 110 may comprise any suitable components for generating charge according to a particular input and/or event. For example, the time-residue generator circuit 110 may comprise a charge storage device coupled to one or more switches, wherein the switches are responsive to various signals to charge the charge storage device to some voltage level or discharge the charge storage device.

In an exemplary embodiment, the time-residue generator circuit 110 may comprise a capacitor 225 to store electrical charge, a current source I connected to voltage source $V_{DD}$ to charge the capacitor 225, and various switches responsive to a signal and/or event to couple the voltage source $V_{DD}$ to the storage device 225. For example, the time-residue generator circuit 110 may be responsive to the compare circuit output Cout and/or the synchronization circuit output SCout. The time-residue generator circuit 110 may comprise switches S3, S4, S5, to couple the capacitor 225 to the current source I, a reference voltage Vref, and/or the compare circuit 205 to discharge the capacitor 225. One switch may be responsive to the synchronization circuit output SCout, for example switch S4, while another switch may be responsive to the compare circuit output Cout, for example switch S3. Each switch S3, S4, S5 may comprise any suitable device responsive to a signal, such as a transistor. For example switches S3, S4, S5 may receive a signal from the control unit and respond accordingly.

The time-residue generator circuit 110 may selectively couple to the first terminal Cin of the compare circuit 105 via switch S6. For example, the capacitor 225 may selectively couple to the compare circuit 105, wherein the compare circuit 105 may compare a voltage across the capacitor Vcap with the ramp voltage Vramp.

The conversion circuit 120 utilizes signals from other components and a predetermined incremental digital input code to convert the input voltage Vin to a digital output ADCout. For example, the conversion circuit 120 may be enabled by signals from the compare circuit 105 and the synchronization circuit 115 to latch (store) the incremental digital input code. The digital input code stored in the conversion circuit 120 may correspond to the input voltage Vin. The conversion circuit 120 may comprise any suitable systems and/or devices configured to count (e.g., incrementing and/or decrementing), latch, multiply, divide, and/or store data. In an exemplary embodiment, the conversion circuit 120 may comprise a counter circuit 135, a least-significant bit (LSB) circuit 125, a most-significant bit (MSB) circuit 130, and a logic unit 140.

The counter circuit 135 generates sequential codes according to an oscillating signal and a control signal. The counter circuit 135 may count up or down depending on the particular value of the control signal. For example, the counter circuit 135 may count up if a positive control signal is applied, and conversely, the counter circuit 135 may count down if a negative or zero-value control signal is applied. The counter circuit 135 may output a binary number containing any number of bits, and the number of bits may be selected according to a particular application. The counter circuit 135 may comprise any suitable system and/or circuit for counting, for example the counter circuit 135 may comprise a Gray code counter.

In an exemplary embodiment, the counter circuit 135 is coupled to a clock signal CLK, wherein the clock signal CLK oscillates between a high and a low state. The clock signal CLK may be generated by a clock generator (not shown). The counter circuit 135 either increments or decrements the binary output number at each pulse of the clock signal CLK.

The counter circuit 135 may also be coupled to a supply voltage, such as $V_{DD}$ or a ground, wherein the supply voltage controls whether the counter circuit 135 increments or decrements. In an exemplary embodiment, the counter circuit 135 increments when a positive voltage, such as $V_{DD}$ is applied, and decrements when the ground is applied. The counter circuit 135 may transmit the binary number to the MSB circuit 130 and the LSB circuit 125.

The MSB circuit 130 determines the most-significant bits (i.e., coarse bits) of a final digital output code. The MSB circuit 130 may comprise any circuit capable of latching a value in response to a predetermined signal. For example, the MSB circuit 130 may receive the binary number from the counter circuit 135 and the MSB circuit 130 may latch in response to the output signal SCout from the synchronization circuit 115.

In an exemplary embodiment, the MSB circuit 130 may comprise a gated D latch circuit 230. The gated D latch circuit 230 may comprise a data input D and an enable terminal $\overline{LE}$. The data input D may receive the binary number from the counter circuit 135, and the enable terminal $\overline{LE}$ may receive the synchronization circuit output SCout. When the gated D latch circuit is enabled (the enable terminal $\overline{LE}$ receives a logic "0"), the signal propagates directly though the circuit from the data input D to an output terminal Q. The binary number that is propagated to the output terminal Q when the MSB circuit 130 is latched may be referred to as the MSB output (MSBout), and may be transmitted to the logic unit 140.

The LSB circuit 125 determines the least-significant bits (i.e., fine bits) of the final digital output code. The LSB circuit 125 may comprise any circuit capable of latching a value in response to a predetermined signal. For example, the LSB circuit 125 may receive the binary number from the counter circuit 135 and the LSB circuit 125 may latch in response to the output signal Cout from the compare circuit 105.

In an exemplary embodiment, the LSB circuit 125 may comprise a gated D latch circuit 235. The gated D latch circuit 235 may comprise a data input D and an enable terminal $\overline{LE}$. The data input D may receive the binary number from the counter circuit 135, and the enable terminal $\overline{LE}$ may receive the compare circuit output Cout. When the gated D latch circuit is enabled (the enable terminal $\overline{LE}$ receives a logic "0"), the signal propagates directly though the circuit from the data input D to an output terminal Q. The binary number that is propagated to the output terminal Q when the LSB circuit 125 is latched may be referred to as the LSB output (LSBout), and may be transmitted to the logic unit 140.

In an alternative embodiment, the ADC 100 may comprise a secondary analog-to-digital converter (not shown) of any suitable type, such as a successive approximation register type, to convert the signal from the time-residue generator circuit 110 to the fine bits. For example, in an embodiment where the time-residue generator circuit 110 comprises the capacitor 225, the secondary analog-to-digital converter may convert the voltage across the capacitor Vcap into the fine bits.

The logic unit 140 may store binary values, perform computations, combine bits to form the final binary output code, and convert the final binary code to a digital output value. The logic unit 140 may comprise any suitable circuit and/or system to store values, for example the logic unit 140 may comprise a memory device to store various data and/or a look-up table. The logic unit 140 may also comprise any suitable circuit and/or system to perform computations, such as multiplication and/or division. The logic unit 140 may be coupled to the MSB circuit 130 and the LSB circuit 125 to obtain the coarse bits and the fine bits, respectively, and may comprise any suitable circuit and/or system to form the binary code utilizing the coarse bits and the fine bits, for example by adding the coarse bits and the fine bits to form the final binary code or by subtracting. The logic unit 140 may further comprise any suitable circuit and/or system to convert the final binary code to the digital output ADCout. For example, the logic unit 140 may comprise a quantizer for storing predetermined output values (expressed in decimal form) corresponding to particular binary codes.

The logic unit 140 may further remove errors in the ADC, such as offset errors, differential nonlinearity errors, gain errors, and the like, all of which may result in an incorrect ADC output. For example, the logic unit 140 may compute an offset error, expressed as a number of LSBs. The offset error may be defined as the difference between an ideal output code and an actual output code, given a particular reference voltage. In ideal cases, the offset error equals 0. In an exemplary embodiment, the actual output code corresponds to the values (coarse and/or fine bit values) generated, given the particular reference voltage. The logic unit 140 may subtract the offset error from the final binary code prior to converting the final binary code to the digital output ADCout.

The ADC 100 may further comprise a reset circuit 145 to clear any charge generated and stored in the time-residue generation circuit 110. The reset circuit may be coupled to the reset signal CALIB_RST and the strobe signal STR, wherein reset circuit 145 is responsive to the reset signal CALIB_RST and the strobe signal. The reset circuit 145 outputs a signal RSTout according to the values of reset signal CALIB_RST and the strobe signal STR. The reset circuit 145 may be selectively coupled to the time-residue generator circuit 110. For example, the reset circuit 145 may be coupled to the time-residue generator circuit 110 via a switch, such as switch S2.

In an exemplary embodiment, the reset circuit 145 may comprise a set-reset latch circuit, such as a conventional SR latch circuit 240 comprising a pair of cross-coupled NOR logic gates. The reset circuit 145 may comprise two input terminals R,S, wherein one input terminal receives the reset signal CALIB_RST, for example terminal S, and the other input terminal receives the strobe signal STR, for example terminal R. The reset circuit 145 may comprise an output terminal Q, wherein the value of the output signal RSTout depends on the values of the reset signal CALIB_RST and the strobe signal STR. In general, if both terminals R and S are low (e.g., logic "0"), the reset circuit 145 is in a hold state. If the reset signal CALIB_RST is pulsed high (e.g., logic "1") while the strobe signal STR is held low, then the output terminal Q is forced high, and stays high when the reset signal CALIB_RST returns to low. Similarly, if the strobe signal STR is pulsed high while the reset signal CALIB_RST is held low, then the output terminal Q is forced low, and stays low when the strobe signal STR returns to low.

The ADC 100 converts the analog input signal to a digital output signal using a two-phase conversion process. A first phase may comprise a coarse conversion phase, and a second phase may comprise a fine conversion phase. For example, in one embodiment, the coarse conversion phase may be associated with the most-significant bits (coarse bits) of the digital output signal, while the fine conversion phase may be associated with the least-significant bits (fine bits) of the digital output signal. The ADC 100 may generate a time-residue signal during the coarse conversion phase and utilize the time-residue signal to determine the LSBs during the fine conversion phase.

In an alternative operation, the ADC 100 may convert the analog input signal into the digital output signal using a multiple phase conversion process to improve the accuracy of the ADC. For example, for a 16-bit ADC, the ADC may only provide 12 bits of accuracy with the two-phase conversion process, but for that same ADC, the multiple conversion process may provide 15 bits of accuracy. The ADC 100 may perform any suitable number of conversion phases. For example, the ADC 100 may perform three phases, comprising one coarse conversion phase and two fine conversion phases. In this case, the first of the two fine conversion phases may produce a middle bit of the final binary code, wherein the middle bit may be defined as one of the coarse bits or one of the fine bits.

During the coarse conversion phase, the ADC converts the input voltage Vin into a coarse bit value, representing the coarse bits, and generates the time-residue signal. In an exemplary operation, referring to FIGS. 1, 2, and 3, initially, the comparator output Cout is high, switch S3 is closed, switch S4 is closed, switch S5 is closed, the capacitor 225 is fully discharged, and the output of the synchronization circuit 115 is high. In addition, the counter circuit 135 is transmitting binary data to the MSB circuit 130 and the LSB circuit 125. The strobe signal STR is synchronized to the clock input CLK of the counter circuit 135. The compare circuit 105, which is coupled to the input voltage Vin and the ramp voltage Vramp, compares the input voltage Vin to the ramp voltage Vramp, and the output of the compare circuit 105 changes according to whether the ramp voltage Vramp is greater than the input voltage Vin.

After some period of time, the ramp voltage Vramp exceeds the input voltage Vin and the compare circuit output Cout switches to low. When this occurs, the compare circuit output Cout goes low, switch S4 opens, and the capacitor 225 begins to charge linearly. The output of the synchronization circuit 115 also goes low at the falling edge of the strobe signal STR that occurs immediately after the compare circuit output Cout goes low. A low value at the output of the synchronization circuit 115 opens switch S3 and a voltage across the capacitor Vcap stops increasing and stays constant. Substantially simultaneously, as the capacitor 225 stops charging, the signal SCout from the synchronization circuit 115 enables the MSB circuit 230, wherein the MSB circuit 230 latches (saves) the binary value that is present at that particular time. During the time when the MSB circuit 130 is enabled, the counter circuit 135 transmits incrementing binary codes to the MSB circuit 130. The latched binary value corresponds to the coarse bits of the final binary code. The MSB circuit 230 may then transmit the binary value (MSBout) to the logic unit 140.

Figure 4:
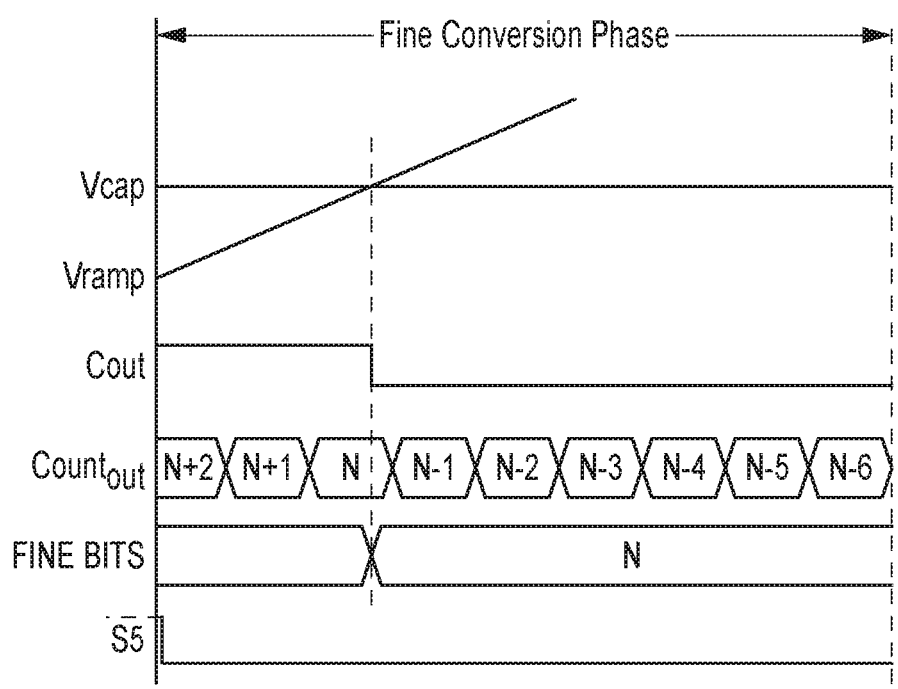
FIG. 4 is a timing diagram of a fine conversion phase of an analog-to-digital converter in accordance with an exemplary embodiment of the present technology.

After the coarse conversion phase, the ADC 100 performs the fine conversion phase, where the voltage across the capacitor 225 is converted to a fine bit value representing the fine bits. In an exemplary operation, referring to FIGS. 1, 2, and 4, switch S5 opens and switch S6 couples to the output of the time-residue generator circuit 110 to the input of the comparator 105. Initially, the comparator output is high. After some time, the ramp voltage Vramp exceeds the voltage across the capacitor Vcap and the output Cout of the compare circuit 105 goes low. When the compare circuit output Cout is low, the LSB circuit 235 is enabled, wherein the LSB circuit 235 latches (saves) the binary value that is present at that particular time. During the time when the LSB circuit 125 is enabled, the counter circuit 135 transmits decrementing binary codes to the LSB circuit 125. The latched binary value corresponds to the fine bits of the final binary code. The LSB circuit 235 may then transmit the binary value (LSBout) to the logic unit 140. In the fine conversion phase, strobe signal STR is unused and may therefore be idle.

The logic unit 140 may then combine the coarse bits and the fine bits to form the final binary code. For example, a 12 bit binary code may comprise 5 coarse bits (i.e., the 5 right-most bits) and 5 fine bits (i.e., the 5 left-most bits). The logic unit 140 may further convert the binary code into an actual signal value utilizing the quantizer. The logic unit 140 may transmit the actual signal value (ADCout) to various components within the electronic system.

In an alternative operation, the counter circuit 135 may transmit either incrementing binary codes or decrementing binary codes during both the coarse conversion phase and the fine conversion phase, rather than incrementing during the coarse phase and decrementing during the fine phase. In this case, the logic unit 140 may subtract the fine bits from the coarse bits to form the final binary code.

The ADC 100 may perform calibration during a calibration phase to remove errors, such as the offset error, gain error, differential nonlinearity errors, and the like, to obtain the correct ADC output. Since the compare circuit 105 changes asynchronously with respect to the strobe signal STR, the ADC 100 may be prone to differential nonlinearity errors in cases where the output of the synchronization circuit 115 is delayed by an additional clock period if it does not receive the compare circuit output Cout within an input set-up time of the synchronization circuit 115. In such cases, the capacitor 225 may be charged for an extra clock period since the time-residue generation circuit 110 receives a delayed signal from the synchronization circuit 115. The delay also allows the counter circuit 135 to increment by one, increasing the value of the coarse bits, since the MSB circuit 130 receives a delayed signal from the synchronization circuit 115. During the fine conversion phase, however, the counter circuit 135 decrements, which results in the fine bit value being smaller than it should be since the greater the voltage across the capacitor 225, the smaller the fine bit value. As such, the calibration phase ensures that there are no differential nonlinearity errors in cases where the capacitor 225 charges for an extra clock period.

During the calibration phase, the ADC 100 may determine a scaling factor to scale the fine bits by this factor prior to being combined with or subtracted from the coarse bits. The ADC 100 may comprise various switches configured to switch to a calibration mode terminal CALIB during the calibration phase.

Figure 2:
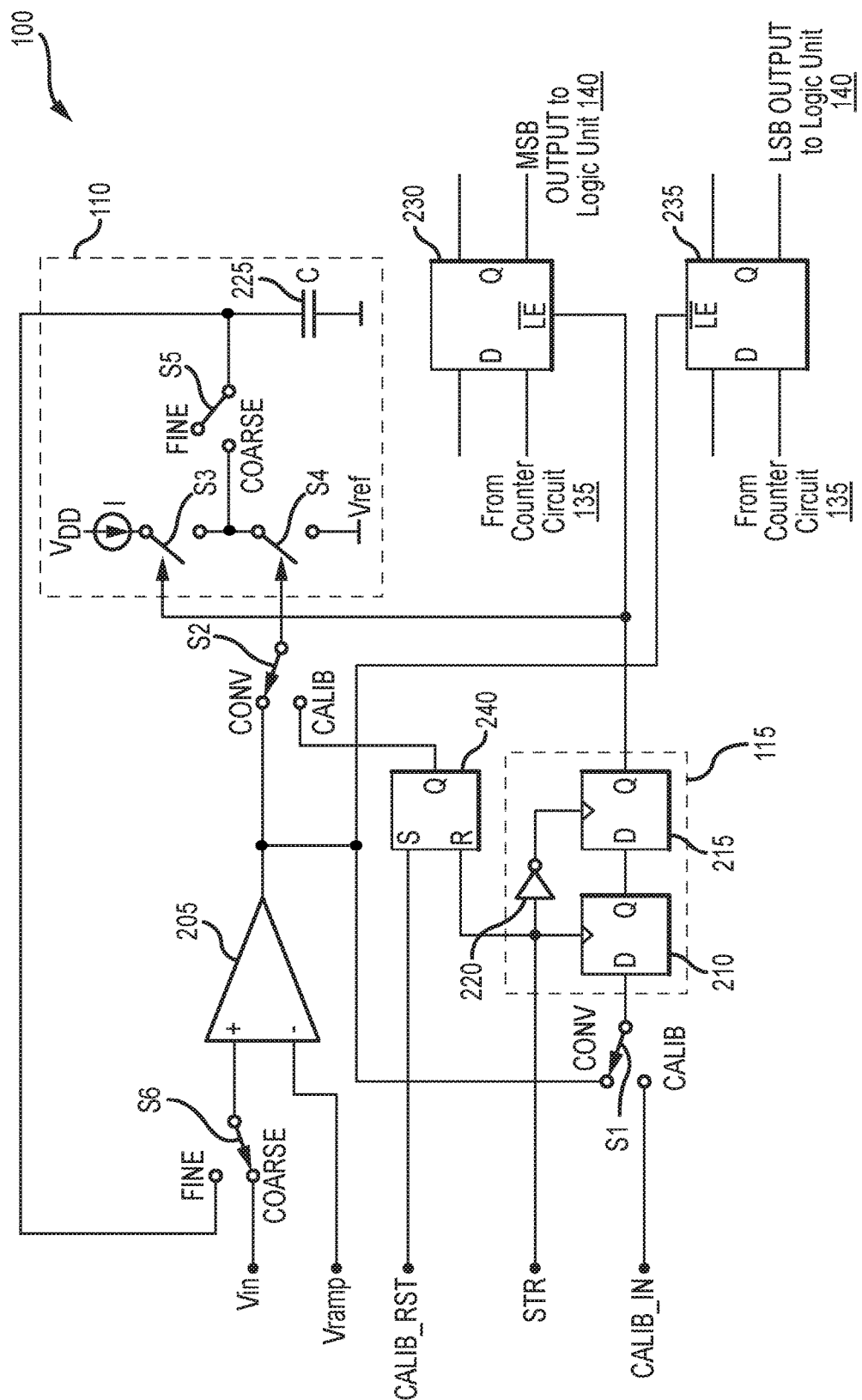
FIG. 2 is a circuit diagram of an analog-to-digital converter in accordance with an exemplary embodiment of the present technology.
Figure 3:
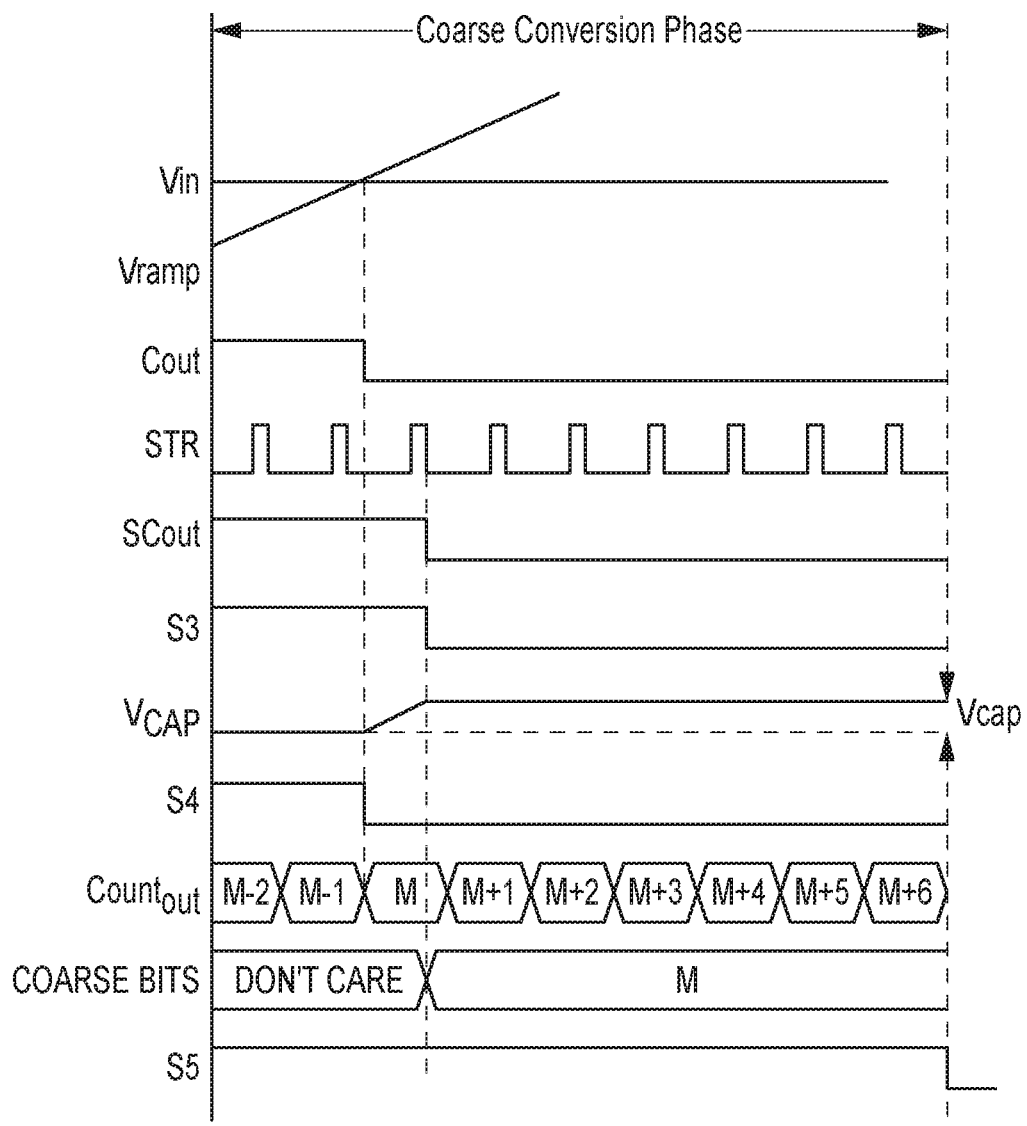
FIG. 3 is a timing diagram of a coarse conversion phase of an analog-to-digital converter in accordance with an exemplary embodiment of the present technology.
Figure 5:
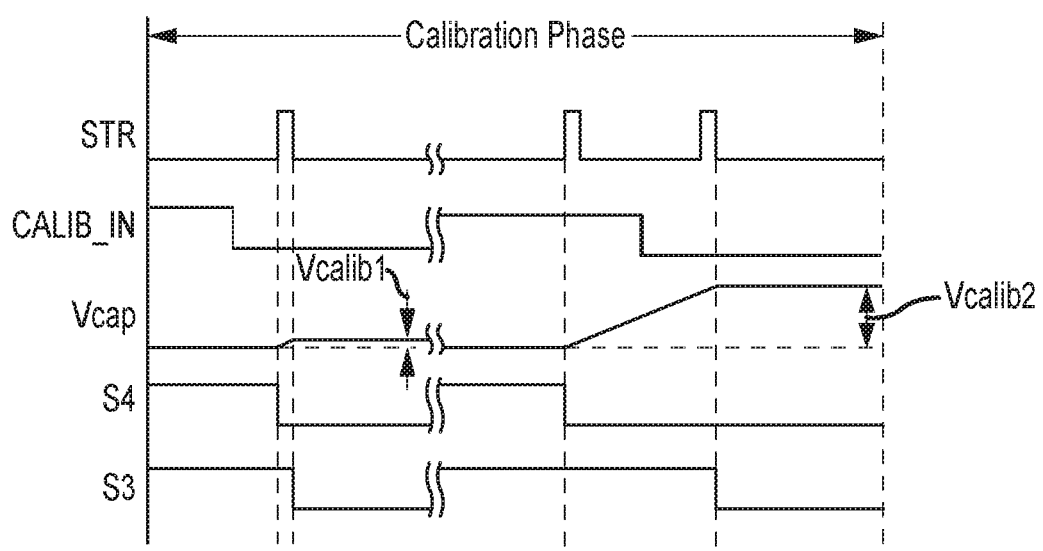
FIG. 5 is a timing diagram of a calibration phase of an analog-to-digital converter in accordance with an exemplary embodiment of the present technology.

In an exemplary operation, referring to FIGS. 1, 2, and 5, the ADC 100 may be configured to obtain two calibration values during the conversion phase and utilize the difference of the two values to determine the scaling factor. The ADC 100 determines first calibration value by coupling the synchronization circuit 115 to the calibration mode terminal CALIB via switch S1. In the calibration mode, the synchronization circuit 115 receives a calibration input signal CALIB_IN and the strobe signal STR. Initially, the calibration input signal CALIB_IN is low and switch S4 is closed. At a rising edge of the strobe signal, switch S4 opens and the capacitor 225 beings to charge. Once the strobe signal returns to a low value, switch S3 opens. Therefore, the capacitor 225 charges only for the duration of the strobe pulse (when the strobe signal is high). After the capacitor 225 charges, switches S1 and S2 are coupled again to the conversion mode terminals CONV, where the ADC 100 converts the voltage across the capacitor 225 in the same manner described above with respect to the fine conversion phase. The logic unit 140 may store the converted value, wherein the converted value represents a first calibration value Vcalib1.

The ADC 100 returns to the calibration phase by coupling switches S1 and S2 to their respective conversion mode terminals CONV. The ADC 100 then asserts the calibration reset signal CALIB_RST which closes switch S4 to discharge any remaining charge on the capacitor 225. At a rising edge of the strobe signal, switch S4 opens and the capacitor 225 beings to charge. Only after the first strobe signal pulse, the ADC 100 pulls low the calibration signal CALIB_IN. This allows the capacitor 225 to charge for an extra strobe cycle compared to the first calibration value Vcalib1. After the capacitor 225 charges, switches S1 and S2 are coupled again to the conversion mode terminals CONV, where the ADC 100 converts the voltage across the capacitor 225 in the same manner described above with respect to the fine conversion phase. The logic unit 140 may store the converted value, wherein the converted value represents a second calibration value Vcalib2.

The logic unit 140 may compute a difference value ΔC (delta value) of the first and second calibration values Vcalib1, Vcalib2 and store the delta value, for example in the memory device. The delta value corresponds to the time period of the strobe signal. In one embodiment, the logic unit 140 may scale the fine bit value of a signal conversion by the delta value by dividing the fine bit value by the delta value. In an alternative embodiment, the logic unit 140 may incorporate a look-up table comprising 1/ΔC values (i.e., scale factors) and multiply the fine bit value by the scale factor. Once the logic unit 140 has scaled the fine bit value, the logic unit 140 may combine (or in some cases, subtract) the scaled fine bit value with the coarse bit value to obtain the final binary code having a full resolution corresponding to the input signal of the ADC 100. The logic unit 140 may translate the final binary code into the actual signal value (e.g., a decimal value) for linear and/or non-linear ramps utilizing conventional mathematical formulas, since the final binary code determined at the end of the fine conversion phase relates to a period of time from the beginning of the ramp signal to the moment at which the value of the ramp signal exceeds the input signal Vin.

The ADC 100 may perform calibration prior to performing the coarse conversion phase and the fine conversion phase. The ADC 100 may perform calibration once, prior to a first conversion. The ADC 100 may further perform subsequent calibrations after the first conversion according to a predetermined calibration schedule.

In embodiments where the signal values undergo digital correlated double sampling, the offset error is automatically removed from the final value as a result of the sampling technique. In other embodiments, however, where the signal values do not undergo digital correlated double sampling, the logic unit 140 may subtract the offset error from the final binary code to obtain the correct digital output ADCout.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An analog-to-digital converter capable of receiving a first signal and a ramp signal, comprising:
   a generator circuit configured to generate a second signal based on a predetermined time interval;
   a compare circuit coupled to the generator circuit and configured to:
      compare the ramp signal to at least one of the first signal and the second signal; and
      generate an output based on the relationship between the ramp signal and at least one of the first signal and the second signal; and
   a conversion circuit coupled to the compare circuit and configured to generate a digital output signal based on the first signal;

wherein the predetermined time interval is the time between a change in the compare circuit output and an immediately following strobe signal.

2. The analog-to-digital converter according to claim 1, wherein the generator circuit comprises:
a current source;
a switch coupled to the current source and responsive to the compare circuit output; and
a capacitor selectively coupled to the current source via the switch, wherein the capacitor charges during the predetermined time interval to generate the second signal.

3. The analog-to-digital converter according to claim 1, wherein the conversion circuit comprises:
a counter circuit, coupled to a current source and a clock signal, and configured to produce a plurality of binary numbers; and
a first storage device coupled to the counter circuit to receive the binary numbers and responsive to the compare circuit output, wherein the first storage device transmits one of the binary numbers according to the compare circuit output, and wherein the transmitted binary number represents a plurality of least-significant bits of the first signal.

4. The analog-to-digital converter according to claim 3, further comprising a second storage device coupled to the counter circuit to receive the binary numbers and responsive to the compare circuit output, wherein the second storage device transmits one of the binary numbers according to the compare circuit output, and wherein the transmitted binary number represents a plurality of most-significant bits of the first signal.

5. The analog-to-digital converter according to claim 4, further comprising a logic unit coupled to the first and second storage devices and configured to convert the least-significant bits and the most-significant bits to a corresponding ADC output value.

6. The analog-to-digital converter according to claim 1, further comprising a synchronization circuit coupled to:
a strobe signal;
at least one of a calibration signal and the compare circuit output; and
the conversion circuit; and
wherein the synchronization circuit is responsive to each of the calibration signal and the compare circuit, and the synchronization circuit transmits a signal to the conversion circuit according to the strobe signal.

7. The analog-to-digital converter according to claim 1, wherein the second signal is generated during a coarse conversion phase, and the compare circuit compares the second signal to the ramp signal during a fine conversion phase.

8. The analog-to-digital converter according to claim 1, further comprising a reset circuit responsive to a reset signal, and selectively coupled to the generator circuit during a calibration phase.

9. A method for converting an analog signal into a digital signal, comprising:
generating a ramp signal;
comparing the analog signal to the ramp signal;
generating a time-residue signal during a coarse conversion phase, wherein the time-residue signal corresponds to a voltage that is proportional to a first predetermined time interval;
comparing the time-residue signal to the ramp signal;
determining a plurality of most-significant bits of the digital signal during the coarse conversion phase; and
determining a plurality of least-significant bits of the digital signal during a fine conversion phase according to the voltage generated during the coarse conversion phase.

10. The method for converting an analog signal into a digital signal according to claim 9, further comprising scaling the least-significant bits according to a calibration factor.

11. The method for converting an analog signal into a digital signal according to claim 9, further comprising calibrating the least-significant bits, wherein calibrating comprises:
determining a first value during a calibration phase;
determining a second value during the calibration phase;
determining a magnitude change from the first value to the second value; and
dividing the least-significant bits by the magnitude change.

12. The method for converting an analog signal into a digital signal according to claim 11, wherein:
determining the first value during the calibration phase comprises charging a capacitor for a second predetermined time interval; and
determining the second value during the calibration phase comprises charging the capacitor for a third predetermined time interval greater than the second predetermined time interval.

13. The method for converting an analog signal into a digital signal according to claim 9, wherein the ramp signal comprises a smooth ramp waveform.

14. An analog-to-digital converter capable of receiving a first signal and a ramp signal, comprising:
a comparator coupled to the first signal and the ramp signal, and configured to:
compare the ramp signal to at least the first signal and a second signal; and
generate an output based on the relationship between the ramp signal and at least one of the first signal and the second signal; and
a generator circuit responsive to the comparator output, comprising:
a current source; and
a capacitor selectively coupled to the current source, wherein the current source charges the capacitor for a predetermined time interval to generate the second signal;
a conversion circuit coupled to the comparator and configured to generate a digital output signal based on the first signal, comprising:
a counter circuit coupled to the current source and a clock signal and configured to produce a plurality of binary numbers; and
a first storage device coupled to the counter circuit to receive the binary numbers and responsive to the comparator output, wherein the first storage device transmits a first binary number according to the comparator output, and wherein the first binary number represents a plurality of least-significant bits of the first signal; and
a second storage device coupled to the counter circuit to receive the binary numbers and responsive to the comparator output, wherein the second storage device transmits a second binary number according to the comparator output, and wherein the second binary number represents a plurality of most-significant bits of the first signal.

15. The analog-to-digital converter according to claim 14, further comprising a logic unit coupled to the first and second storage devices and configured to convert the least-significant bits and the most-significant bits to a corresponding ADC output value.

16. The analog-to-digital converter according to claim 14, further comprising a synchronization circuit coupled to:
 a strobe signal;
 at least one of a calibration signal and the comparator output; and
 the conversion circuit; and
 wherein the synchronization circuit is responsive to each of the calibration signal and the comparator, and the synchronization circuit transmits a signal to the conversion circuit according to the strobe signal.

17. The analog-to-digital converter according to claim 14, wherein the predetermined time interval is the time between a change in the comparator output and an immediately following strobe signal.

18. The analog-to-digital converter according to claim 14, wherein the second signal is generated during a coarse conversion phase, and the comparator compares the second signal to the ramp signal during a fine conversion phase.

19. The analog-to-digital converter according to claim 14, further comprising a reset circuit responsive to a reset signal, and wherein the reset circuit selectively couples to the generator circuit during a calibration phase.

* * * * *